(12) United States Patent
Akahori et al.

(10) Patent No.: US 9,664,727 B2
(45) Date of Patent: May 30, 2017

(54) ELECTRIC CURRENT APPLICATION METHOD AND ELECTRIC CURRENT APPLYING DEVICE

(71) Applicant: HONDA MOTOR CO., LTD., Tokyo (JP)

(72) Inventors: Shigeto Akahori, Tochigi (JP); Nobuo Kambara, Tochigi (JP)

(73) Assignee: HONDA MOTOR CO., LTD., Tokyo (JP)

( * ) Notice: Subject to any disclaimer, the term of this patent is extended or adjusted under 35 U.S.C. 154(b) by 67 days.

(21) Appl. No.: 14/270,604

(22) Filed: May 6, 2014

(65) Prior Publication Data
US 2014/0333342 A1 Nov. 13, 2014

(30) Foreign Application Priority Data
May 8, 2013 (JP) .................. 2013-098603

(51) Int. Cl.
*G01R 31/26* (2014.01)
(52) U.S. Cl.
CPC .................. *G01R 31/2601* (2013.01)
(58) Field of Classification Search
CPC ........................................ G01R 31/26
USPC ........................................ 324/762
See application file for complete search history.

(56) References Cited

U.S. PATENT DOCUMENTS

| | | | | |
|---|---|---|---|---|
| 5,426,373 | A | * | 6/1995 | Diamond ............... G01N 27/02 324/457 |
| 5,650,737 | A | * | 7/1997 | Eilley ................ H03K 17/0822 327/108 |
| 2003/0062919 | A1 | * | 4/2003 | Vargas ................... G01N 27/92 324/762.1 |
| 2007/0109000 | A1 | * | 5/2007 | Inoue ................... G01R 1/0483 324/756.05 |
| 2013/0161749 | A1 | * | 6/2013 | Kim .................... H01L 27/0266 257/355 |

(Continued)

FOREIGN PATENT DOCUMENTS

| | | |
|---|---|---|
| JP | 63-115762 U | 7/1988 |
| JP | 2001-281283 | 10/2001 |
| JP | 2002-048845 | 2/2002 |

(Continued)

OTHER PUBLICATIONS

Japanese Office Action dated Jan. 20, 2015, 2 pages.

*Primary Examiner* — Son Le
*Assistant Examiner* — Akm Zakaria
(74) *Attorney, Agent, or Firm* — Rankin, Hill & Clark LLP

(57) ABSTRACT

An electric current application method for applying electric current to a power semiconductor 100 having a first signal pin contact region 102 that conducts a first electric current, and a contacting body contact region 101 that electrically connects with the first signal pin contact region 102 and conducts a second electric current, includes a Step S1 of contacting a first signal pin 32 of a probe device 1 to the first signal pin contact region 102 so as to eliminate residual electricity remaining in the first signal pin contact region 102 and contacting body contact region 101; and Steps S3 and S4 of contacting a contacting part 21 of the contacting body 2 of the probe device 1 to the contacting body contact region 101, and conducting the first electric current and second electric current, after Step S1.

2 Claims, 6 Drawing Sheets

(56) References Cited

U.S. PATENT DOCUMENTS

2014/0167799 A1* 6/2014 Wang .................... H02H 9/046
                                                    324/750.14

FOREIGN PATENT DOCUMENTS

| JP | 2006-337247 | 12/2006 |
| JP | 2007-218635 | 8/2007 |
| JP | 2011-137791 | 7/2011 |

* cited by examiner

FIG. 3
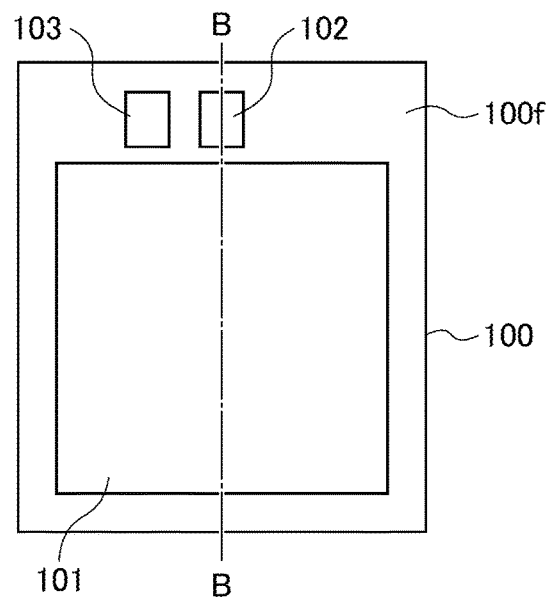
(a)
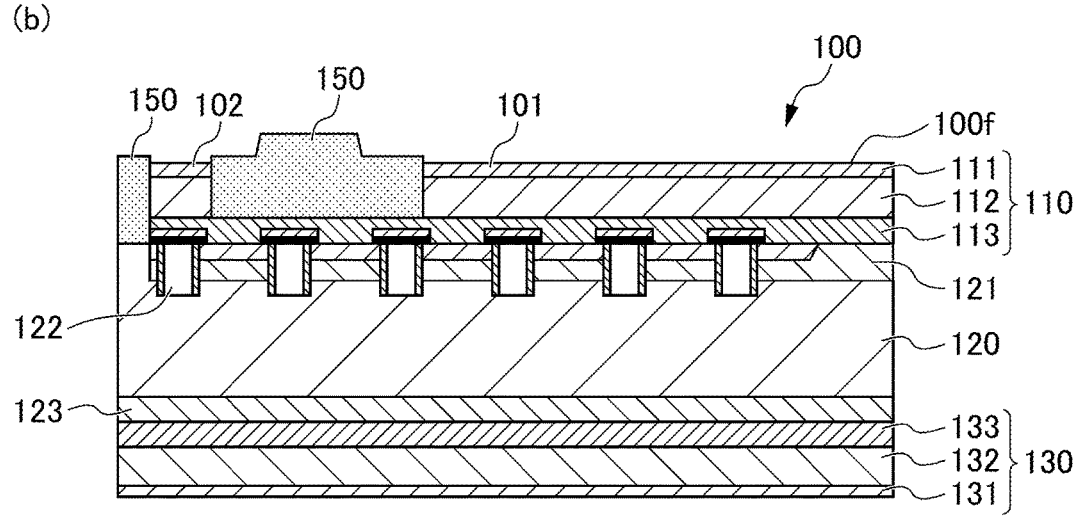
(b)

FIG. 5
(a)
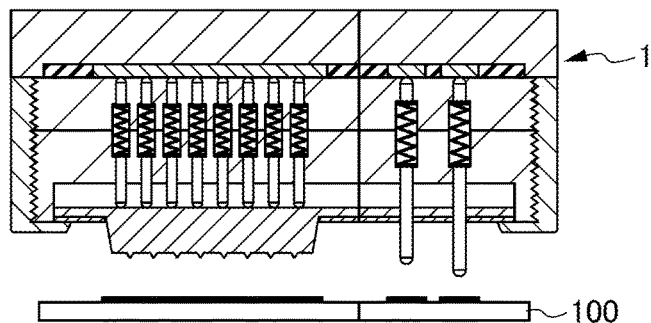
(b)
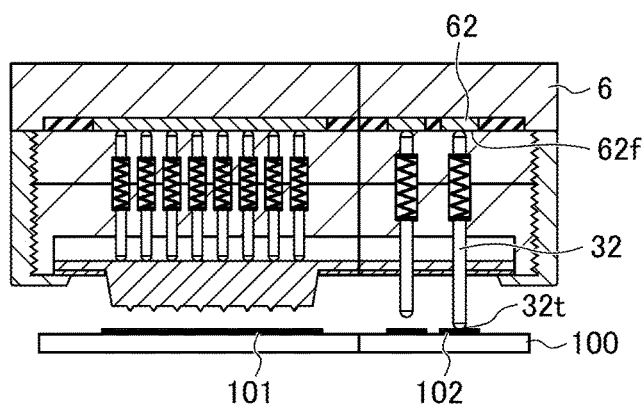
(c)
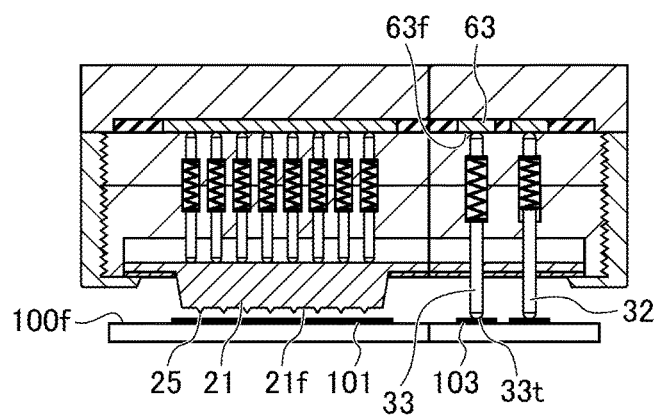
(d)
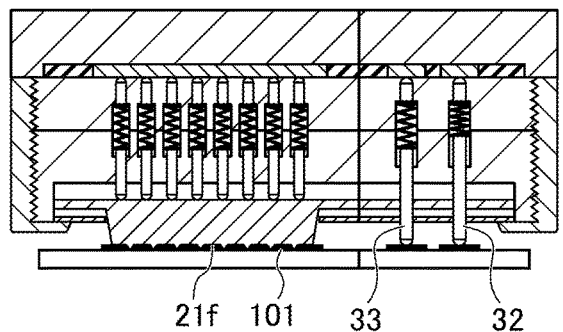

FIG. 6
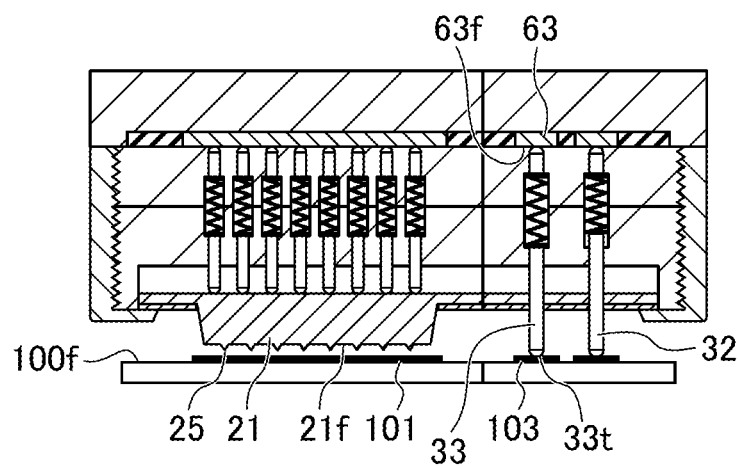
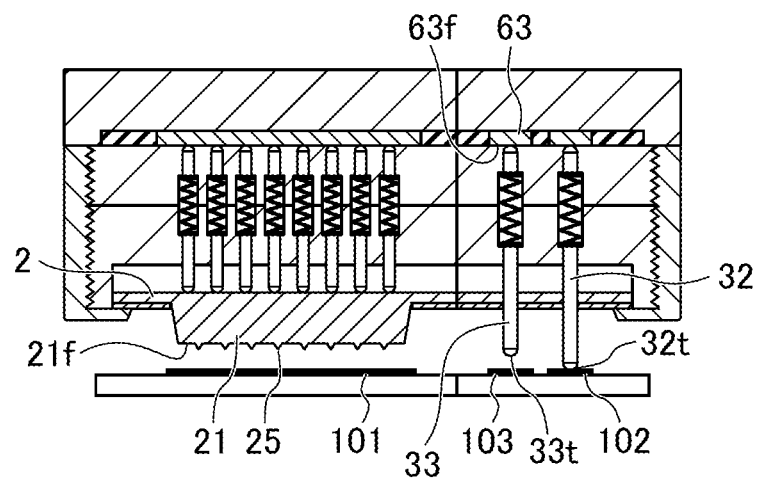
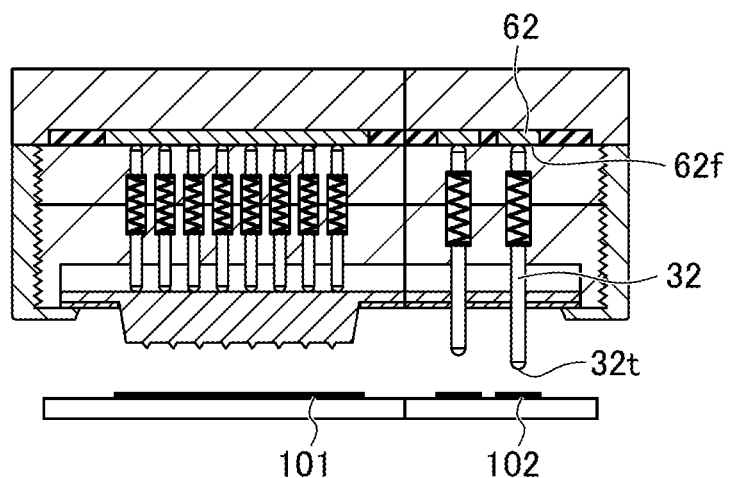

ELECTRIC CURRENT APPLICATION METHOD AND ELECTRIC CURRENT APPLYING DEVICE

This application is based on and claims the benefit of priority from Japanese Patent Application No. 2013-098603, filed on 8 May 2013, the content of which is incorporated herein by reference.

BACKGROUND OF THE INVENTION

Field of the Invention

The present invention relates to an electric current application method and electric current applying device for applying electric current to a semiconductor. In particular, it relates to an electric current application method and electric current applying device used in the inspection of a power semiconductor for which it is necessary to applying high current.

Related Art

Heretofore, a technology related to probe pins for high current that makes the leading end of a probe head contact a semiconductor to pass current therethrough has been known (for example, refer to Patent Document 1). With the technology disclosed in Patent Document 1, the probe pin includes: an abutting member in which a plurality of contacting parts for electrical conductance is formed and arranged to be distributed; a plunger consisting of a rod-shaped conducting body, at which the abutting member is mounted to a leading end, and is connected at a tail end to an electrical wire end; and a coil spring biasing the plunger so as to cause the abutting member to abut a semiconductor. Then, a periphery of the abutting member diverges radially to form contacting parts, a central part of the abutting member is fixed to the plunger by a latch inserted into a latch insertion hole in a depression at a face of the leading end of the plunger, and the contacting parts extend from an inner circumferential edge of the depression to the outer circumferential side.

According to this technology of Patent Document 1, the contacting part of the abutting member swings like a seesaw with the inner circumferential edge of the depression acting as a supporting point when abutting the semiconductor. Then, while swinging, fluctuation in the contact pressure is alleviated by deformation of a central adjacency portion of the contacting part of the abutting member, and even if there is some unevenness or waves in the probe pin abutting site of the surface of the semiconductor, it is said that the contact state between the many contacting parts of the abutting member and the surface of the semiconductor will all be stable.

[Patent Document 1] Japanese Unexamined Patent Application, Publication No. 2011-137791

SUMMARY OF THE INVENTION

Here, the probe pin enters a state making contact with the semiconductor to be conductible from a state separated from the semiconductor. In this regard, when residual electricity in the semiconductor is transmitted to the probe pin the instant when making the probe pin contact with the semiconductor, an electrical voltage exceeding the withstand voltage occurs between the gate-emitter, which is the site of lowest withstand voltage in the semiconductor, and the semiconductor may be destroyed.

The present invention is for solving the above-mentioned problems, and an object thereof is to provide an electric current application method and electric current applying device that prevent destruction of a semiconductor caused by residual electricity in a semiconductor.

According to a first aspect of the invention, in an electric current application method of applying electric current to a semiconductor (e.g., the power semiconductor 100 described later) that includes: a first electric current carrying part (e.g., the first signal pin contact region 102 described later) that conducts a first electric current, and a second electric current carrying part (e.g., the contacting body contact region 101 described later) that is electrically connected with the first electric current carrying part and that conducts a second electric current, the method includes: a residual electricity eliminating step of contacting a first electrode (e.g., the first signal pin 32 described later) of an electric current applying device (e.g., the probe device 1 described later) to the first electric current carrying part, and eliminating residual electricity remaining in the first electric current carrying part and the second electric current carrying part (e.g., Step S1 described later); and a main electric current conducting step of contacting a second electrode (e.g., the contacting part 21 described later) of the electric current applying device to the second electric current carrying part, and conducting the first electric current and the second electric current, after the residual electricity eliminating step (e.g., Steps S3 and S4 described later).

According to the first aspect of the invention, the first electrode of the electric current applying device is made to contact the first electric current carrying part in the residual electricity eliminating step first, so as to eliminate residual electricity remaining in the first electric current carrying part and the second electric current carrying part electrically connected to the first electric current carrying part. Then, in the main electric current conducting step, the second electrode of the electric current applying device is made to contact the second electric current carrying part, and the first electric current and second electric current are conducted.

The first electrode is thereby made to contact the first electric current carrying part prior to the second electrode of the electric current applying device contacting the second electric current carrying part, whereby it is possible to eliminate residual electricity from the first electric current carrying part and second electric current carrying part inside the semiconductor. For this reason, at the moment the second electrode is made to contact the second electric current carrying part of the semiconductor, there is no residual electricity in the second electric current carrying part in semiconductor, and electrical voltage does not arise between the gate-emitter, which are at locations of the lowest withstand voltage in the semiconductor. Therefore, it is possible to prevent damage of the semiconductor caused by residual electricity in the semiconductor.

According to a second aspect of the invention, the electric current application method as described in the first aspect further includes: a second electrode separating step of separating the second electrode from the second electric current carrying part, after the main electric current conducting step (e.g., Step S5 described later); and a first electrode separating step of separating the first electrode from the first electric current carrying part, after the second electrode separating step (e.g., Step S7 described later).

According to the second aspect of the invention, in the second electrode separating step after the main electric current conducting step, the second electrode is made to separate from the second electric current carrying part.

Subsequently, in the first electrode separating step, the first electrode is made to separate from the first electric current carrying part.

The first electrode is not made to separate from the first electric current carrying part even after the second electrode is separated from the second electric current carrying part, and thus it is possible to ultimately eliminate residual electricity from the first electric current carrying part and second electric current carrying part in the semiconductor. Therefore, residual electricity can be suppressed from remaining in the semiconductor after electric current application.

According to a third aspect of the invention, an electric current applying device (e.g., the probe device 1 described later) that applies electric current to a semiconductor (e.g., the power semiconductor 100 described later) includes: a first electrode (e.g., the first signal pin 32 described later) that contacts a first electric current carrying part (e.g., the first signal pin contact region 102 described later) of the semiconductor; and a second electrode (e.g., the contacting part 21 described later) that contacts a second electric current carrying part (e.g., the contacting body contact region 101 described later) of the semiconductor that is electrically connected with the first electric current carrying part, in which the first electrode contacts the semiconductor before the second electrode.

Similar functions and effects as the first aspect of the invention are exerted by the third aspect of the invention.

According to a fourth aspect of the invention, in the electric current applying device as described in the third aspect, the first electrode separates from the semiconductor later than the second electrode.

Similar functions and effects as the second aspect of the invention are exerted by the fourth aspect of the invention.

According to the present invention, it is possible to provide an electric current application method and an electric current applying device that prevent destruction of a semiconductor caused by residual electricity in a semiconductor.

BRIEF DESCRIPTION OF THE DRAWINGS

FIG. 3 provides views showing a power semiconductor according to the embodiment, with FIG. 3(a) being a top view, and FIG. 3(b) being a cross-sectional view along the line BB in FIG. 3(a).

FIG. 5 is a state diagram 1 of each step of semiconductor inspection using the probe device according to the embodiment, with FIG. 5(a) being a standby state diagram, FIG. 5(b) being a contact state diagram between a first signal pin and a power semiconductor, FIG. 5(c) being a contact state diagram between a second signal pin and a power semiconductor, and FIG. 5(d) being a contact state diagram between a contacting body and a power semiconductor; and FIG. 6 is a state diagram 2 of each step of semiconductor inspection using the probe device according to the embodiment, with FIG. 6(a) being a separated state diagram between the contacting body and power semiconductor, FIG. 6(b) being a separated state diagram between the second signal pin and power semiconductor, and FIG. 6(c) being a separated state diagram between the first signal pin and power semiconductor.

DETAILED DESCRIPTION OF THE INVENTION

Hereinafter, an embodiment of the present invention will be explained.

Figure 1:
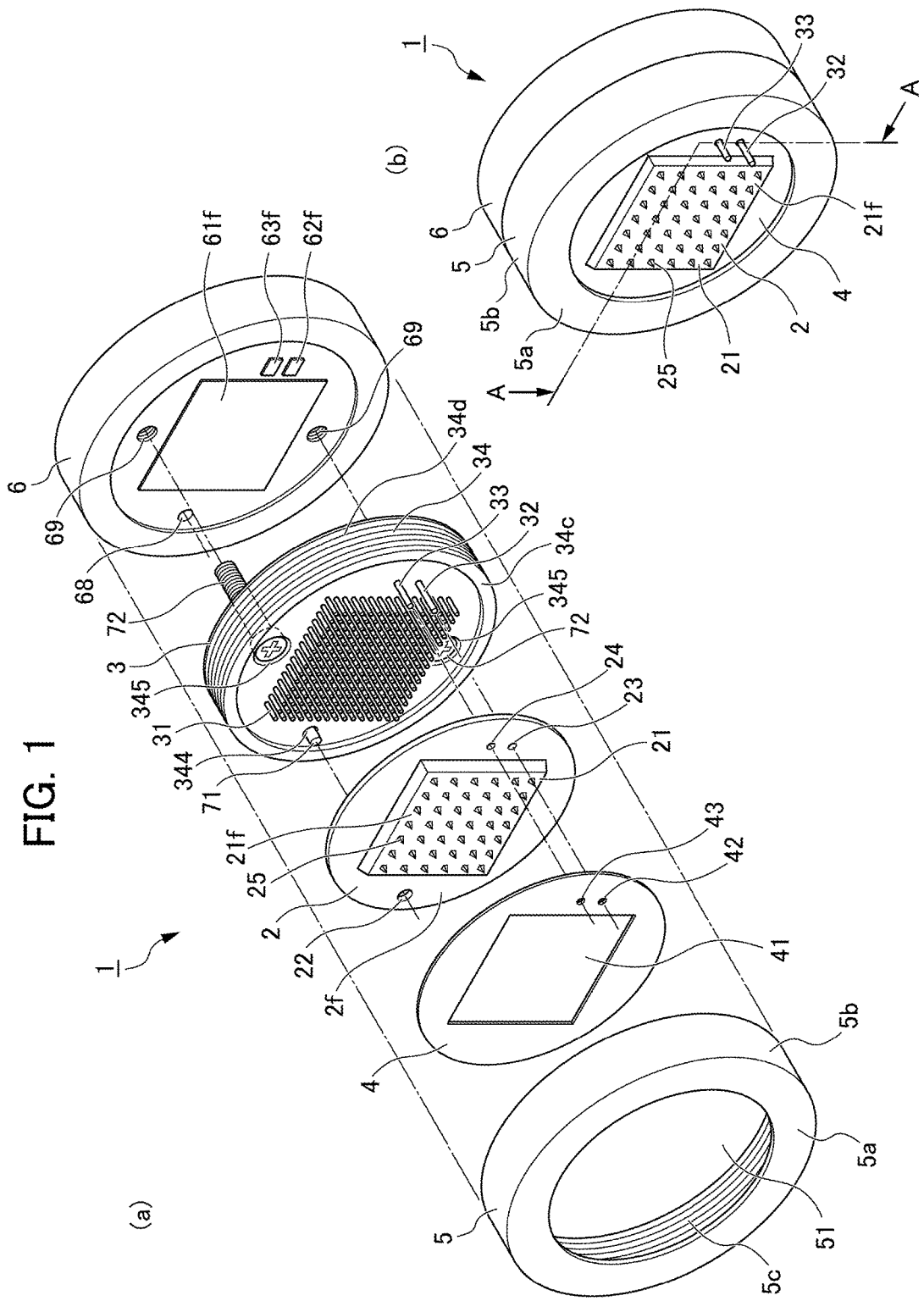
FIG. 1 provides perspective views showing an outline configuration of a probe device according to an embodiment of the present invention, with FIG. 1(a) being an exploded view and FIG. 1(b) being an overall view.
Figure 2:
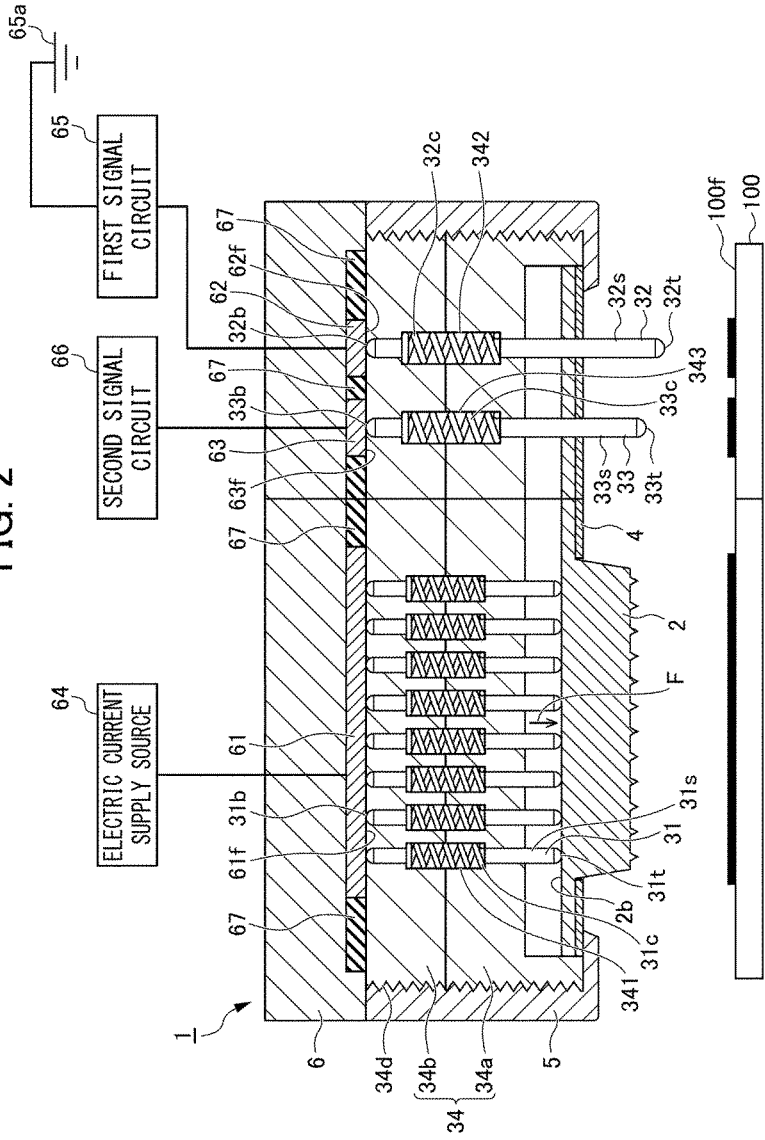
FIG. 2 is a cross-sectional view along the line AA in FIG. 1(b) of the probe device according to the embodiment.

FIG. 1 provides perspective views showing an outline configuration of a probe device 1 as a electric current applying device according to an embodiment of the present invention, with FIG. 1(a) being an exploded view and FIG. 1(b) being an overall view. FIG. 2 is a cross-sectional view along the line AA in FIG. 1(b) of the probe device 1 according to the embodiment. The cross-section along the line AA in FIG. 1(b) changes the cross-sectional position midway in order to facilitate understanding of the cross-sectional configuration of the probe device 1.

The probe device 1 shown in FIG. 1 is applied to a semiconductor inspection device for inspecting a power semiconductor (IGBT, MOS, diodes, etc.) 100 used in the switching of high current of 400 to 2000 A, and applies high current by pressure contacting the power semiconductor 100.

The probe device 1 includes a contacting body 2, a pressing body assembly 3, an insulation plate 4, a fixed cover 5, and a base 6.

As shown in FIG. 1, the contacting body 2 is a disk shape, has a contacting part 21 of a quadrilateral shape in the center thereof, a size smaller than the power semiconductor 100 (refer to FIG. 3) of quadrilateral shape, projecting to the power semiconductor 100 side. The contacting body 2 is constituted from nickel.

The contacting body 2 has, in the vicinity of the contact part 21, one positioning hole 22 that penetrates in a thickness direction thereof in order for a positioning rod 71 to be inserted.

The contacting body 2 has, on an opposite to the positioning hole 22 relative the contact part 21, the two of a first signal pin hole 23 and second signal pin hole 24 that penetrate in the thickness direction thereof in order for each of the first signal pin 32 and second signal pin 33 to penetrate.

The contact part 21 has a surface 21$f$ that surface contacts with a surface 100$f$ of the power semiconductor 100. The surface 21$f$ has a plurality of microspikes 25 that plugs into only a surface electrode layer of a top layer of the power semiconductor 100. Even with the contact part 21 having the plurality of microspikes 25, the surface 21$f$ is a very large flat surface compared to the plurality of microspikes 25.

The plurality of microspikes 25 is smaller than about 10 μm, which is the layer thickness of the surface electrode layer of the power semiconductor 100, and is formed by electroforming in a height higher than about 0.1 μm, which is the film thickness of an oxide film formed at the surface of the surface electrode layer.

As shown in FIG. 2, the pressing body assembly 3 has a plurality of pressing pins 31, a first signal pin 32, a second signal pin 33 and a case 34.

Each of the plurality of pressing pins 31 is rod shaped, and has conductivity. The leading end 31$t$ and tail end 31$b$ of each of the plurality of pressing pins 31 are formed in a semi-circular shape, causing the frictional drag to decline. A central part of each of the plurality of pressing pins 31 has a spring 31$c$ that elastically rebounds. The outside diameter of the spring 31$c$ of the pressing pin 31 is larger than the outside diameter of a rod-shaped leading end part 31s and tail end part, which are other than the spring 31c of the pressing pin 31.

The pressing pin 31 contacts with the back surface 2b of the contacting body 2 by way of the leading end 31t projecting from the case 34, and the contact position thereof is movable. The pressing pins 31 are aligned at equal intervals in a planar direction on the back surface 2b of the contacting body 2, and impart a pressing force F on each of the plurality of sections of the contacting body 2.

The pressing pin 31 contacts the surface 61f of the pressing pin electrode 61 of the base 6 by the tail end 31b projecting from the case 34, and a second electric current can flow in from the pressing pin electrode 61 of the base 6.

The first signal pin 32 is rod shaped, and has conductivity. The leading end 32t and tail end 32b of the first signal pin 32 are formed in a semi-circular shape, causing the frictional drag to decline. A central part of the first signal pin 32 has a spring 32c that elastically rebounds. The outside diameter of the spring 32c of the first signal pin 32 is larger than the outside diameter of a rod-shaped leading end part 32s and tail end part, which are other than the spring 32c of the first signal pin 32. For the first signal pin 32, the length of the rod-shaped leading end part 32s on the leading end side of the spring 32c is longer than the length of the rod-shaped leading end part 31s of the pressing pin 31.

The first signal pin 32 inputs the first electric current related to the emitter of the power semiconductor 100 to the power semiconductor 100.

The first signal pin 32 contacts the surface 100f of the power semiconductor 100 by the leading end 32t projecting from the case 34, and the contact position thereof is moveable.

The first signal pin 32 contacts the surface 62f of the first signal pin electrode 62 of the base 6 by the tail end 32b projecting from the case 34, and is able to deliver an electrical signal that is the first electric current of the first signal pin electrode 62 of the base 6.

The second signal pin 33 is the same configuration as the first signal pin 32. For the second signal pin 33, the length of the rod-shaped leading end part 33s on the leading end side of the spring 33c is longer than the length of the rod-shaped leading end part 31s of the pressing pin 31, and shorter than the length of the rod-shaped leading end part 32s of the first signal pin 32.

The second signal pin 33 inputs a control signal to control ON/OFF of the power semiconductor 100 at the gate of the power semiconductor 100 to the power semiconductor 100.

The second signal pin 33 contacts the surface 100f of the power semiconductor 100 by the leading end 33t projecting from the case 34, and the contact position thereof is moveable.

The second signal pin 33 contacts the surface 63f of the second signal pin electrode 63 of the base 6 by the tail end 33b projecting from the case 34, and is able to deliver an electrical signal of the second signal pin electrode 63 of the base 6.

As shown in FIG. 2, in the probe device 1, a leading end 32t of the first signal pin 32 projects the most, a leading end 33t of the second signal pin 33 projects next to the leading end 32t of the first signal pin 32, and the surface 21f having the microspikes 25 of the contacting part 21 of the contacting body 2 projects next to these.

The case 34 is constituted from two case members 34a and 34b, which are a pair of disk members shown in FIG. 2, and includes a plurality of pressing pin holes 341, a first signal pin hole 342 and a second signal pin hole 343.

The plurality of pressing pins 31, first signal pin 32 and second signal pin 33 are arranged in the case member 34a by accommodating a spring part 31c, 32c and 33c of each pin 31, 32 and 33 in hollow parts for spring parts of the respective holes 341, 342 and 343, on one case member 34a into which the case 34 is divided in two, and constitute a pressing body assembly 3 by subsequently integrating together the two case members 34a and 34b.

As shown in FIG. 1, around the plurality of pressing pin holes 341, the case 34 has one positioning hole 344 that penetrates in the thickness direction thereof in order for the positioning rod 71 to be inserted, and two fixing holes 345 that penetrate in the thickness direction thereof in order for fixing bolts 72 to be inserted. The fixing holes 345 have an accommodating part that accommodates the head of the fixing bolt 72, and the two fixing holes 345 are arranged to be separated via the plurality of pressing pin holes 341 on a line passing through the center point of the case 34.

The case 34 has, on the surface of the leading end side, an annular convex part 34c that projects to the power semiconductor 100 side in order to guide the outer circumference of the contacting body 2. The annular convex part 34c can accommodate the contacting body 2 inside, and the inner circumferential surface gently regulates the movement of the contacting body 2.

The case 34 has a threaded part 34d in an outer circumferential surface.

As shown in FIG. 2, the plurality of pressing pin holes 341 is aligned at equal intervals in a planar direction in the same range as the contacting part 21 of the contacting body 2. Each of the plurality of pressing pin holes 341 penetrates the thickness direction of the case 34, and the pressing pins 31 are arranged therein. In other words, a central part of the pressing pin hole 341 is formed to be a hollow part larger in inside diameter than other portions that match the size of the spring part 31c of the pressing pin 31, and the pressing pin 31 is arranged in the pressing pin hole 341 by accommodating the spring part 31c of the pressing pin 31 in this hollow part. The pressing pin 31 accommodated in the pressing pin hole 341 allows the leading end 31t and tail end 31b to project to outside of the case 34 via the rod-shaped leading end part 31s and tail end part inserted in the pressing pin hole 341. It is preferable for each of the plurality of pressing pin holes 341 to have an inner surface thereof formed to be smooth so that the pressing pins 31 can move smoothly inside of the pressing pin holes 341.

One first signal pin hole 342 is formed in an adjoining region of the plurality of pressing pin holes 341. The first signal pin hole 342 penetrates in a thickness direction of the case 34, and the first signal pin 32 is arranged therein. In other words, a central part of the first signal pin hole 342 is formed to be a hollow part larger in inside diameter than other portions matching the size of the spring part 32c of the first signal pin 32, and the first signal pin 32 is arranged in the first signal pin hole 342 by accommodating the spring part 32c of the first signal pin 32 in this hollow part. The first signal pin 32 accommodated in the first signal pin hole 342 allows the leading end 32t and tail end 32b to project to outside of the case 34 via the rod-shaped leading end part 32s and tail end part inserted in the first signal pin hole 342. It is preferable for the first signal pin hole 342 to have an inner surface thereof formed to be smooth so that the first signal pin 32 can move smoothly inside of the first signal pin hole 342.

One second signal pin hole 343 is formed adjacent to the first signal pin hole 342 in an adjoining region of the plurality of pressing pin holes 341. The second signal pin hole 343 has the same configuration as the first signal pin hole 342.

As shown in FIG. 1, the insulation plate 4 is a disk shape, is configured by an insulating member, and when the probe device 1 is assembled, is positioned at a leading end of the probe device 1.

The insulation plate 4 has an opening 41 in the center. The insulation plate 4 covers the surface 2f exposed around the contacting part 21 of the contacting body 2, while allowing the contacting part 21 of the contacting body 2 to project to the power semiconductor 100 side by allowing to pass through the opening 41.

The insulation plate 4, in the vicinity of the opening 41, has the first signal pin hole 42 and second signal pin hole 43 through which each of the first signal pin 32 and second signal pin 33 are inserted.

As shown in FIG. 1, the fixing cover 5 is an annular member, and has a circular-ring part 5a and a cylindrical part 5b. The circular-ring part 5a has, at the inner side, a bore 51 that is a smaller diameter than the outside diameter of the insulation plate 4 and is larger than the opening 41 of the insulation plate 4. The cylindrical part 5b extends from the circular-ring part 5a toward the base 6 direction, and has a threaded part 5c at an inner circumferential surface. The threaded part 5c formed in the inner circumferential surface of the cylindrical part 5b of the fixing cover 5 threads together with the threaded part 34d formed in the outer circumferential surface of the case 34 of the pressing body assembly 3.

As shown in FIG. 2, the base 6 is a disk shape of the same diameter as the fixing cover 5. The base 6 has a pressing pin electrode 61, first signal pin electrode 62 and second signal pin electrode 63.

The pressing pin electrode 61 is formed in a range in which the tail end 31b of the plurality of pressing pins 31 projects, and is connected to an electric current supply source 64 of the second electric current. A surface 61f of the pressing pin electrode 61 is formed to be smooth, and when the probe device 1 is assembled, contacts the tail end 31b of the plurality of pressing pins 31.

The first signal pin electrode 62 is formed at a position to which the tail end 32b of the first signal pin projects, and is connected to the first signal circuit 65, which supplies the first electric current as well as being linked to ground at the ground part 65a. The surface 62f of the first signal pin electrode 62 is formed to be smooth, and when the probe device 1 is assembled, contacts the tail end 32b of the first signal pin 32.

The second signal pin electrode 63 is formed at a position to which the tail end 33b of the second signal pin 33 projects, and is connected to a second signal circuit 66 supplying a control signal. The surface 63f of the second signal pin electrode 63 is formed to be smooth, and when the probe device 1 is assembled, contacts the tail end 33b of the second signal pin 33.

Each of the pressing pin electrode 61, first signal pin electrode 62 and second signal pin electrode 63 are divided by interposing insulating material 67 inside of the base 6 so as not to conduct with each other.

As shown in FIG. 1, the base 6 includes one positioning hole 68 into which the positioning rod 71 is inserted, and two fixing holes 69 to which fixing bolts 72 are fixed. The fixing holes 69 are configured as threaded holes that thread with the threaded part of the fixing bolts 72.

The probe device 1 is assembled by mounting the fixing cover 5 using the one positioning rod 71 and two fixing bolts 72.

More specifically, the pressing body assembly 3 is positioned on the base 6, and the one positioning rod 71 is inserted in the positioning hole 344 of the pressing body assembly 3, and inserted into the positioning hole 68 of the base 6. In addition, the two fixing bolts 72 are inserted into the fixing holes 345 of the pressing body assembly 3, and inserted into the fixing holes 69 of the base 6. The positional relationship between the base 6 and pressing body assembly 3 is thereby regulated.

Next, the two fixing bolts 72 are threaded to the fixing holes 69 of the base 6 to fix the pressing body assembly 3 to the base 6. In this state, the leading end of the positioning rod 71 projects from the surface of the pressing body assembly 3. The contacting body 2 is gently positioned by inserting the leading end of this projecting positioning rod 71 into the positioning hole 22 of the contacting body 2, and arranging the contacting body 2 inside of the annular convex part 34c. At this time, a back surface 2b of the contacting body 2 contacts the leading ends 31t of the projecting pressing pins 31 of the pressing body assembly 3. The contacting body 2 is movable even in the positioned state.

Then, the insulation plate 4 is made to cover the contacting body 2, and in this state, the threaded part 5c formed in the inner circumferential surface of the cylindrical part 5b of the fixing cover 5 is threaded to the threaded part 34d formed in the outer circumferential surface of the pressing body assembly 3, thereby fixing the fixing cover 5 to the pressing body assembly 3. At this time, the surface 2f of the contacting body 2 is pressed in the direction of the base 6 to the circular-ring part 5a of the fixing cover 5, while the back surface 2b of the contacting body 2 is pressed in an opposite direction to the pressing direction by the fixing cover 5 from the leading ends 31t of the projecting pressing pins 31.

The contacting body 2 is destroyed upon detecting an abnormality in the power semiconductor 100 in semiconductor inspection. For this reason, the contacting body 2 has a different replacement frequency than other components. With the probe device 1, the contacting body 2 is replaceable by, in reverse to assembly of the probe device 1 explained in the foregoing, simply loosening the threaded part 5c formed in the inner circumferential surface of the cylindrical part 5b of the fixing cover 5 relative to the threaded part 34d formed in the outer circumferential surface of the pressing body assembly 3, and removing the fixing cover 5.

Next, the power semiconductor 100 will be explained.

FIG. 3 provides views showing the power semiconductor 100 according to the embodiment, with FIG. 3(a) being a top view, and FIG. 3(b) being a cross-sectional view along the line BB in FIG. 3(a).

The power semiconductor 100 is an IGBT, MOS, diode, etc. used in the switching of high current of 400 to 2000 A. The power semiconductor 100 is arranged on a mounting stand that is not illustrated. The mounting stand is connected to a cylinder that is not illustrated, and the cylinder pushes the power semiconductor 100 on the mounting stand against the probe device 1.

As shown in FIG. 3(a), the power semiconductor 100 is configured in a quadrilateral shape, has inside thereof a contacting body contact region 101, first signal pin contact region 102 and second signal pin contact region 103.

The contacting body contact region 101 is formed in a range in which the contact part 21 of the contacting body 2 contacts, serves as an emitter of the power semiconductor 100, and inputs the second electric current from the probe device 1.

The first signal pin contact region 102 is formed in a range in which the first signal pin 32 contacts, serves as an emitter of the power semiconductor 100, and inputs the first electric current from the probe device 1.

The second signal pin contact region 103 is formed in a range in which the second signal pin 33 contacts, serves as a gate of the power semiconductor 100, and inputs a control signal from the probe device 1.

As shown in FIG. 3(b), the power semiconductor 100 includes a surface plated layer 110, semiconductor layer 120 and back surface plated layer 130.

The surface plated layer 110 is configured from a gold layer 111, nickel layer 112 and aluminum layer 113. The gold layer 111 and nickel layer 112 are insulated by an insulating body 150 using polyimide, and the contacting body contact region 101 and first signal pin contact region 102 are isolated. On the other hand, the aluminum layer 113 is not insulated by the insulating body 150 using polyimide, and the contacting body contact region 101 and first signal pin contact region 102 are electrically connected (conductive).

The semiconductor layer 120 is a silicon layer. The semiconductor layer 120 includes an emitter 121 and gate 122 on a surface side, and includes a collector 123 on a back surface side.

The back surface plated layer 130 is configured from a gold layer 131, nickel layer 132 and aluminum layer 133. The back surface plated layer 130 does not have an insulating body using polyimide.

Next, inspection of the power semiconductor 100 using the probe device 1 will be explained.

Figure 4:
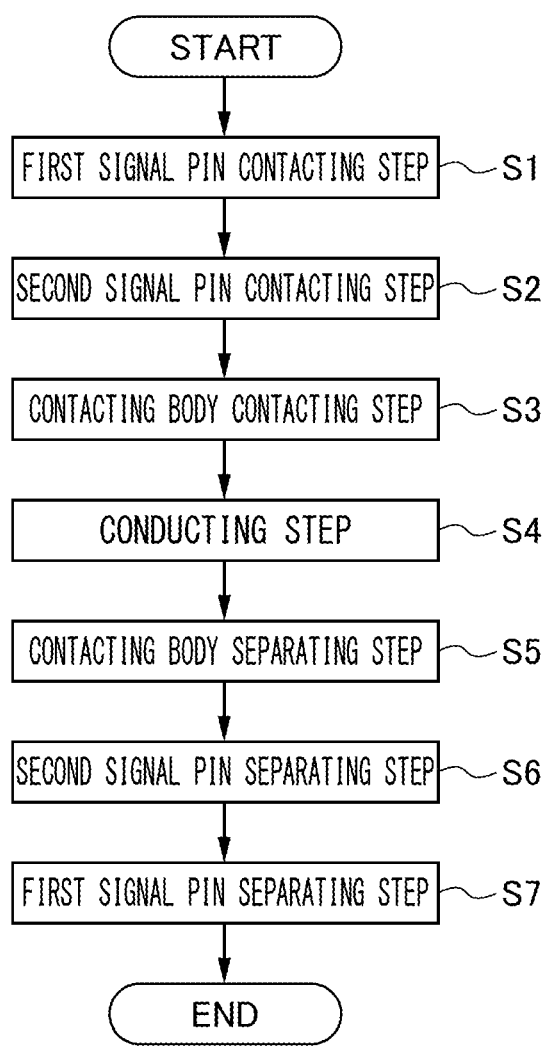
FIG. 4 is a process drawing of semiconductor inspection using the probe device according to the embodiment.

FIG. 4 is a process drawing of semiconductor inspection using the probe device 1 according to the present embodiment.

FIG. 5 is a state diagram 1 of each step of semiconductor inspection using the probe device 1 according to the present embodiment, with FIG. 5(a) being a standby state diagram, FIG. 5(b) being a contact state diagram between the first signal pin 32 and the power semiconductor 100, FIG. 5(c) being a contact state diagram between the second signal pin 33 and the power semiconductor 100, and FIG. 5(d) being a contact state diagram between the contacting body 2 and the power semiconductor 100.

FIG. 6 is a state diagram 2 of each step of semiconductor inspection using the probe device 1 according to the present embodiment, with FIG. 6(a) being a separated state diagram between the contacting body 2 and power semiconductor 100, FIG. 6(b) being a separated state diagram between the second signal pin 33 and power semiconductor 100, and FIG. 6(c) being a separated state diagram between the first signal pin 32 and power semiconductor 100.

As shown in FIG. 5(a), the probe device 1 is initially in the standby state separated from the power semiconductor 100.

The mounting stand on which the power semiconductor 100 is mounted advances in the direction of the probe device 1 by way of the cylinder first, when inspection is started.

As shown in FIG. 5(b), in Step S1, the leading end 32t of the first signal pin 32 contacts the first signal pin contact region 102 of the power semiconductor 100 accompanying advancement of the mounting stand (first signal pin contacting step).

The first signal pin 32 causes the tail end 32b to contact the surface 62f of the first signal pin electrode 62 of the base 6, and is conducting with the first signal circuit 65. The first signal circuit 65 is linked and grounded to the ground part 65a. For this reason, when the leading end 32t of the first signal pin 32 contacts the first signal pin contact region 102 of the power semiconductor 100, the residual electricity remaining in the first signal pin contact region 102 flows to the ground part 65a of the first signal circuit 65 and is eliminated. In addition, the first signal pin contact region 102 is electrically connected with the contacting body contact region 101 by the aluminum layer 113 of the surface plated layer 110; therefore, residual electricity remaining in the contacting body contact region 101 also flows to the ground part 65a of the first signal circuit 65 and is eliminated.

As shown in FIG. 5(c), in Step S2, the leading end 33t of the second signal pin 33 contacts the second signal pin contact region 103 of the power semiconductor 103 accompanying the advancement of the mounting stand (second signal pin contacting step).

The second signal pin 33 causes the tail end 33b to contact the surface 63f of the second signal pin electrode 63 of the base 6, and is conducting with the second signal circuit 66. The second signal circuit 66 applies a control signal, and thus is not grounded. For this reason, if the second signal pin 33 contacted the power semiconductor 100 simultaneously or before the first signal pin 32, there would be concern over an adverse effect arising in the elimination of residual electricity remaining in the contacting body contact region 101 using the first signal pin 32. Therefore, it is configured so that the leading end 33t of the second signal pin 33 is not allowed to project more than the leading end 32t of the first signal pin 32, and the leading end 33t of the second signal pin 33 contacts the power semiconductor 100 after the leading end 32t of the second signal pin 32. In addition, if the second signal pin 33 contacts the power semiconductor 100 prior to the surface 21f of the contacting part 21 of the contacting body 2, it is possible to make the surface 21f of the contacting part 21 of the contacting body 2 contact the power semiconductor 100 last in consideration of the contact pressure of the second signal pin 33 to the power semiconductor 100, and thus it is easy for the surface 21f of the contacting part 21 of the contacting body 2 to adjust the parallelism relative to the surface 100f of the power semiconductor 100 tends to.

As shown in FIG. 5(d), in Step S3, the surface 21f of the contacting part 21 of the contacting body 2 contacts the contacting body contact region 101 of the power semiconductor 100 accompanying the advancement of the mounting stand (contacting body contacting step).

More specifically, first, the plurality of microspikes 25 is inserted into only the surface electrode layer of the surface of the power semiconductor 100. The plurality of microspikes 25 thereby plays the role of spikes, and the position of the contacting body 2 relative to the power semiconductor 100 is positioned.

Furthermore, when the power semiconductor 100 is pressed to the probe device 1 by the cylinder, the contacting body 2 separates from the fixing cover 5, and enters a floating state. Then, the contacting body 2 slopes following the incline of the surface 100f of the power semiconductor 100, the pressing pins 31 that are strongly pressing contract, and thus weakly pressing pins 31 exhibit a pressing force F, and the respective pressing pins 31 keep a balance between the pressing force F and contraction. The plurality of pressing pins 31 thereby adjust the parallelism between the surface 21f of the contacting part 21 of the contacting body 2 and the surface 100f of the power semiconductor 100, thereby unifying the contact surface pressure of the contacting body 2 to the surface 100$f$ of the power semiconductor 100. Then, the surface 21$f$ of the contacting part 21 of the contacting body 2 uniformly contacts and is pressed to the surface 100$f$ of the power semiconductor 100.

In particular, the contacting body 2 is one member in which the entirety of the back surface 2$b$ is pressed to the plurality of pressing pins 31, and the behavior of the plurality of pressing pins 31 is reflected to swing with agility, whereby the parallelism with the surface 100$f$ of the power semiconductor 100 is adjusted.

At this time, horizontal friction, twisting, vibration, etc. may occur when the mounting stand is pushed to the probe device 1 by the cylinder. Addressing this, the plurality of pressing pins 31 have little frictional resistance due to the leading ends 31$t$ being semi-spherical shape; therefore, horizontal friction, twisting, vibration, etc. occurring in the mounting stand can be absorbed by shifting of the contact position of the leading ends 31$t$ contacting the back surface 2$b$ of the contacting body 2. The contact state of the contacting body 2 relative to the surface of the power semiconductor 100 is not influenced by horizontal friction, twisting, vibration, etc., and the plurality of the microspikes 25 does not scrape the surface of the power semiconductor 100 caused by positional shift of the contacting body 2.

Then, the surface 21$f$ of the contacting part 21 of the contacting body 2 serves as a regulating surface that is a flat surface which is very large compared to the plurality of microspikes 25, and regulates insertion to the surface electrode layer by the plurality of microspikes 25. For this reason, the surface 21$f$ maintains an abutting state against the power semiconductor 100, and regulates excessive insertion to the surface electrode layer by the plurality of microspikes 25, even in a case of further pressure being subjected after the plurality of microspikes 25 are inserted to the surface electrode layer of the power semiconductor 100.

In Step S4, the electric current supply source 64 behind the base 6 supplies the second electric current, which is high current, to the contacting body 2 via the plurality of pressing pins 31, the first signal circuit 65 behind the base 6 supplies the first electric current to the first signal pin 32, and the second signal circuit 66 behind the base 6 inputs a control signal to control ON/OFF of the power semiconductor 100 to the second signal pin 33, thereby executing inspection of the power semiconductor 100 (conducting step).

The mounting stand retracts in the opposite direction to the probe device 1 by way of the cylinder, after inspection execution.

As shown in FIG. 6(*a*), in Step S5, the surface 21$f$ of the contacting part 21 of the contacting body 2 separates from the contacting body contact region 101 of the power semiconductor 100 accompanying retraction of the mounting stand (contacting body separating step).

As shown in FIG. 6(*b*), in Step S6, the leading end 33$t$ of the second signal pin 33 separates from the second signal pin contact region 103 of the power semiconductor 100 accompanying retraction of the mounting stand (second signal pin separating step).

The second signal pin 33 separates the tail end 33$b$ from the surface 63$f$ of the second signal pin electrode 63 of the base 6, and becomes non-conducting with the second signal circuit 66. The second signal circuit 66 applies a control signal, and thus is not grounded. For this reason, if the second signal pin 33 separated from the power semiconductor 100 simultaneously or after the first signal pin 32, there would be concern over an adverse effect arising in the elimination of residual electricity remaining in the contacting body contact region 101 using the first signal pin 32. Therefore, it is configured so that the leading end 33$t$ of the second signal pin 33 is not allowed to project more than the leading end 32$t$ of the first signal pin 32, and the leading end 33$t$ of the second signal pin 33 separates from the power semiconductor 100 prior to the leading end 32$t$ of the first signal pin 32. In addition, when the leading end 33$t$ of the second signal pin 33 separates from the power semiconductor 100 after the surface 21$f$ of the contacting part 21 of the contacting body 2, the contacting body 2 can be separated from the power semiconductor 100 early, and there is no influence of impact and changes in contact pressure upon the second signal pin 33 separating; therefore, the plurality of microspikes 25 of the contacting body 2 will not cause damage to the surface of the power semiconductor 100.

As shown in FIG. 6(*c*), in Step S7, the leading end 32$t$ of the first signal pin 32 separates from the first signal pin contact region 102 of the power semiconductor 100 accompanying retraction of the mounting stand (first signal pin separating step).

The first signal pin 32 separates the tail end 32$b$ from the surface 62$f$ of the first signal pin electrode 62 of the base 6, and becomes non-conducting with the first signal circuit 65. The first signal circuit 65 is grounded. For this reason, when the leading end 32$t$ of the first signal pin 32 separates from the first signal pin contact region 102 of the power semiconductor 100 last, residual electricity remaining in the first signal pin contact region 102 and the contacting body contact region 101 electrically connected to the first signal pin contact region 102 in inspection flows to the ground part 65$a$ of the first signal circuit 65 and can be eliminated ultimately.

Then, the probe device 1 returns to the standby state.

The following effects are exerted by the probe device 1 according to the above present embodiment.

(1) First, in Step S1, the first signal pin 32 of the probe device 1 is made to contact the first signal pin contact region 102, thereby eliminating residual electricity remaining in the first signal pin contact region 102 and the contacting body contact region 101 electrically connected with this first signal pin contact region 102. Then, in Steps S3 and S4, the contacting part 21 of the contacting body 2 of the probe device 1 is made to contact the contacting body contact region 101, thereby passing the first electric current and second electric current.

The first signal pin 32 is thereby made to contact the first signal pin contact region 102 prior to the contacting part 21 of the contacting body 2 of the probe device 1 contacting the contacting body contact region 101, and thus residual electricity can be eliminated from the first signal pin contact region 102 and the contacting body contact region 101 in the power semiconductor 100. For this reason, at the moment the contacting part 21 of the contacting body 2 is made to contact the contacting body contact region 101 of the power semiconductor 100, there is no residual electricity in the contacting body contact region 101 of the power semiconductor 100, and electrical voltage does not arise between the gate 122-emitter 121, which are at locations of the lowest withstand voltage in the power semiconductor 100. Therefore, it is possible to prevent damage of the power semiconductor 100 caused by residual electricity in the power semiconductor 100.

(2) In Step S5, the contacting part 21 of the contacting body 2 is made to separate from the contacting body contact region 101. Subsequently, in Step S7, the first signal pin 32 is made to separate from the first signal pin contact region 102.

The first signal pin 32 is not made to separate from the first signal pin contact region 102 even after the contacting part 21 of the contacting body 2 is separated from the contacting body contact region 101, and thus it is possible to ultimately eliminate residual electricity from the first signal pin contact region 102 and contacting body contact region 101 in the power semiconductor 100. Therefore, residual electricity can be suppressed from remaining in the power semiconductor 100 after electric current application.

The present invention is not to be limited to the above-mentioned embodiment, and that modifications, improvements, etc. within a scope that can achieve the objects of the present invention are included in the present invention.

What is claimed is:

1. An electric current application method of applying electric current to a semiconductor that includes: a first electric current carrying part that conducts a first electric current, a second electric current carrying part that is electrically connected with the first electric current carrying part and that conducts a second electric current, and a contact region that inputs a control signal, the method comprising:

a residual electricity eliminating step of contacting a first electrode of an electric current applying device to the first electric current carrying part, and eliminating residual electricity remaining in the first electric current carrying part and the second electric current carrying part;

a contacting step of contacting a signal electrode of the electric current applying device with the contact region, after the residual electricity eliminating step;

a main electric current conducting step of contacting, from the same side as the first electrode, a second electrode of the electric current applying device to the second electric current carrying part, conducting the first electric current and the second electric current, and inputting a control signal, after the contacting step;

a second electrode separating step of separating the second electrode from the second electric current carrying part, after the main electric current conducting step; and a first electrode separating step of separating the first electrode from the first electric current carrying part, after the second electrode separating step.

2. An electric current applying device that applies electric current to a semiconductor, the device comprising:

a first electrode that contacts a first electric current carrying part of the semiconductor that conducts a first current;

a second electrode that contacts, from the same side as the first electrode, a second electric current carrying part of the semiconductor that is electrically connected with the first electric current carrying part, and conducts a second current; and a signal electrode that inputs a control signal to a contact region of the semiconductor, wherein the first electrode contacts the semiconductor before the second electrode, and eliminates residual electricity remaining in the first current carrying part and the second current carrying part, wherein the signal electrode contacts the contact region inputting a control signal of the semiconductor, after the first electrode, wherein the second electrode contacts the second current carrying part after the first electrode and the signal electrode, and conducts the first current and the second current, and wherein the first electrode separates from the semiconductor later than the second electrode.

* * * * *